United States Patent
Venkatesan et al.

(10) Patent No.: US 10,637,695 B1
(45) Date of Patent: Apr. 28, 2020

(54) HIGH-SPEED LOW-VOLTAGE SERIAL LINK RECEIVER AND METHOD THEREOF

(71) Applicant: Realtek Semiconductor Corp., Hsinchu (TW)

(72) Inventors: Sriram Venkatesan, Fremont, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/527,104

(22) Filed: Jul. 31, 2019

(51) Int. Cl.
| | | |
|---|---|---|
| *H04L 27/01* | (2006.01) | |
| *H04L 25/03* | (2006.01) | |
| *H04L 25/06* | (2006.01) | |
| *H03H 7/38* | (2006.01) | |
| *H03F 3/45* | (2006.01) | |
| *H04L 25/02* | (2006.01) | |

(52) U.S. Cl.
CPC ... *H04L 25/03885* (2013.01); *H03F 3/45179* (2013.01); *H03H 7/38* (2013.01); *H04L 25/0278* (2013.01); *H04L 25/063* (2013.01); *H04L 27/01* (2013.01)

(58) Field of Classification Search
CPC ......... H04L 25/03057; H04L 25/03019; H04L 2025/0349; H04L 25/03031; H04L 27/01; H04L 25/03878; H04B 3/145; H04B 10/2941
USPC .................................................. 375/229–233
See application file for complete search history.

(56) References Cited

U.S. PATENT DOCUMENTS

| | | | | |
|---|---|---|---|---|
| 8,222,967 B1 * | 7/2012 | Raman | ..................... | H03F 3/193 333/28 R |
| 8,335,249 B1 * | 12/2012 | Su | ........................ | H03F 3/45197 375/232 |
| 9,319,004 B2 * | 4/2016 | Bandyopadhyay | .......................... | H03F 3/45475 |
| 9,450,788 B1 * | 9/2016 | Cops | .................. | H04L 25/03057 |
| 9,537,681 B1 * | 1/2017 | Chan | .................. | H04L 25/03057 |
| 10,270,409 B1 * | 4/2019 | Forey | ................... | H03G 3/3078 |
| 2014/0255037 A1 * | 9/2014 | Shang | ................ | H04B 10/6971 398/115 |
| 2017/0250730 A1 * | 8/2017 | Chang | ..................... | H04B 3/14 |

* cited by examiner

*Primary Examiner* — Emmanuel Bayard
(74) *Attorney, Agent, or Firm* — McClure, Qualey & Rodack, LLP

(57) ABSTRACT

A receiver includes a passive CTLE (continuous-time linear equalizer) configured to receive a first voltage signal from a first node and output a current signal to a second node in accordance with a first control signal; a CG (common-gate) amplifier configured to receive the current signal and output a second voltage signal at a third node in accordance with a second control signal; a first active inductor configured to provide an inductive load at the third node; a CS (common-source) CTLE configured to receive the second voltage signal and output a third voltage signal at a fourth node in accordance with a third control signal; a second active inductor configured to provide an inductive load at the fourth node; and a decision circuit configured to receive the third voltage signal and output a decision in accordance with a clock signal.

20 Claims, 5 Drawing Sheets

HIGH-SPEED LOW-VOLTAGE SERIAL LINK RECEIVER AND METHOD THEREOF

BACKGROUND OF THE DISCLOSURE

Field of the Disclosure

The present disclosure generally relates to serial link receiver and more specifically to a high-speed serial link receiver with improved impedance matching and equalization.

Description of Related Art

As is known, a serial link comprises a transmitter, a channel, and a receiver. The transmitter converts a first data sequence into a first voltage signal comprising a succession of symbols. A speed of the serial link is characterized by a unit interval of said symbols: the shorter unit interval, the higher speed. The first voltage signal is launched onto a first end of the channel, propagating along the channel, and eventually turning into a second voltage signal at a second end of the channel. The second voltage signal is received, processed, and detected by the receiver and eventually converted into a second data sequence. A goal of the receiver is to ensure that the second data sequence is the same as the first data sequence, except for a delay in time. In practice, the second voltage signal is subject to impairments such as dispersion caused by the channel and cannot be reliably detected. Instead, the second voltage signal needs to be converted into a third voltage signal that can be reliably detected, by applying equalization that can compensate the dispersion caused by the channel.

In practice, however, equalization itself may also introduce impairments, such as: DC (direct current) offsets, additive noises, nonlinear distortion, and secondary dispersion. A higher speed serial link is more susceptible to the secondary dispersion, as a shorter unit interval has less margin of error. In addition, an impedance matching between the second end of the channel and an input port of the receiver is highly desirable so to alleviate aggravation of dispersion due to reflection resulting from an impedance mismatch.

A serial link receiver is often embodied by a monolithic integrated circuit fabricated using a CMOS (complementary metal oxide semiconductor) process. A trend in CMOS process technologies is to have a low supply voltage to reduce power consumption. A low supply voltage, however, often poses a great challenge in circuit design for a receiver, as a signal to noise ratio is limited by a small headroom constrained by the low supply voltage. Power supply is often a major source of additive noises. The receiver needs to have a good immunity to noises from the power supply.

What is desired is a high-speed low-voltage serial link receiver directed to fulfilling impedance matching and equalization while effectively alleviating impairments from DC offset, power supply noises, nonlinear distortion, and secondary dispersion.

BRIEF DESCRIPTION OF THIS DISCLOSURE

In an embodiment, a receiver comprises: a passive CTLE (continuous-time linear equalizer) configured to receive a first voltage signal from a first node and output a current signal to a second node in accordance with a first control signal; a CG (common-gate) amplifier configured to receive the current signal and output a second voltage signal at a third node in accordance with a second control signal; a first active inductor configured to provide an inductive load at the third node; a CS (common-source) CTLE configured to receive the second voltage signal and output a third voltage signal at a fourth node in accordance with a third control signal; a second active inductor configured to provide an inductive load at the fourth node; and a decision circuit configured to receive the third voltage signal and output a decision in accordance with a clock signal, wherein: a first part of the first control signal determines an input resistance at the first node and a low-frequency gain of the passive CTLE, a second part of the first control signal determines a high-frequency gain of the passive CTLE, a first part of the third control signal determines a low-frequency gain of the CS CTLE, and a second part of the third control signal determines a transition frequency of the CS CTLE.

In an embodiment, a method comprises: receiving a first voltage signal from a first node; converting the first voltage signal into a first current signal delivered toward a second node using a passive CTLE (continuous-time linear equalizer) in accordance with a first control signal, wherein a first part of the first control signal determines an input resistance at the first node and a low-frequency gain of the passive CTLE, while a second part of the first control signal determines a high-frequency gain of the passive CTLE; converting the first current signal into a second voltage signal at a third node using a CG (common-gate) amplifier controlled by a second control signal; loading the third node using a first active inductor; converting the second voltage signal into a third voltage signal at a fourth node using a CS (common-source) CTLE in accordance with a third control signal, wherein a first part of the third control signal determines a low-frequency gain of the CS CTLE, while a second part of the third control signal determines a transition frequency of the CS CTLE; loading the fourth node using a second active inductor; and outputting a first decision based on the third voltage signal in accordance with a clock signal.

BRIEF DESCRIPTION OF THE DRAWINGS

Various aspects of the disclosure can be better understood with reference to the following drawings. The components in the drawings are not necessarily to scale, with emphasis instead being placed upon clearly illustrating the principles of the present disclosure. Moreover, in the drawings, like reference numerals designate corresponding parts throughout the several views.

DETAILED DESCRIPTION OF THIS DISCLOSURE

Figure 1A:
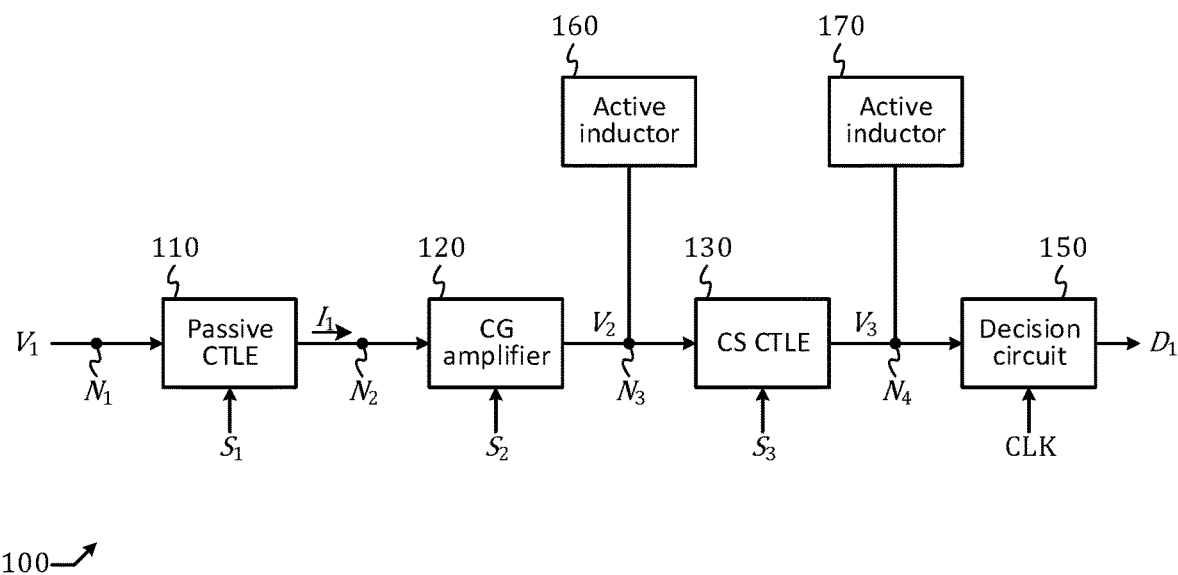
FIG. 1A shows a functional block diagram of a receiver in accordance with an embodiment of the present disclosure.

The present disclosure is directed to serial link receivers. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "CMOS (complementary metal oxide semiconductor)," "NMOS (N-channel metal oxide semiconductor) transistor," "PMOS (N-channel metal oxide semiconductor) transistor," "resistor," "capacitor," "resistance," "capacitance," "current source," "bias," "AC (alternate current)," "DC (direct current)," "amplifier," "gain," "common-source," "common-gate," "transconductance," "load," "impedance," "impedance matching," "series," "shunt," "clock," "frequency," "saturation region," "source degeneration," "flip flop," and "Laplace transform." Terms like these are used in a context of microelectronics, and the associated concepts are apparent to those of ordinary skills in the art and thus will not be explained in detail here. Those of ordinary skill in the art also recognize symbols like that of NMOS transistors, and identify the "source," the "gate," and the "drain" terminals thereof. Those of ordinary skill in the art also understand units such as "Ohm," "KOhm (kilo-Ohm)," "fF (femto-Farad)," and "mV (mini-Volt)."

Throughout this disclosure, "$V_{DD}$" denotes a power supply node. By way of example but not limitation, a 28 nm CMOS (complementary metal oxide semiconductor) process is used for fabrication, and a supply voltage of "$V_{DD}$" is substantially 0.9V, which is said to be a low voltage.

Further, this disclosure is presented from the perspective of engineers, rather than a theoretical sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

In this disclosure, a signal is embodied in either a voltage or a current that represents a certain information.

A passive circuit comprises only passive elements such as capacitor and resistor. An active circuit comprises at least a transistor. An active inductor is an active circuit that exhibits an inductive impedance, which is an impedance that has a positive imaginary part.

A clock signal is a voltage signal that cyclically and periodically toggles back and forth between a low level and a high level. By way of example but not limitation, the low level is substantially 0V, while the high level is substantially 0.9V.

Throughout this disclosure, "$V_{DD}$" denotes a power supply node. For convenience, "$V_{DD}$" can also refer to a supply voltage provided by the power supply node. That is, "$V_{DD}$ is 0.9V" means "a supply voltage at the power supply node $V_{DD}$ is 0.9V" (or substantially 0.9V).

A functional block diagram of a receiver 100 in accordance with an embodiment of the present disclosure is depicted in FIG. 1A. Receiver 100 comprises: a passive CTLE (continuous-time linear equalizer) 110 configured to receive a first voltage signal $V_1$ from a first node $N_1$ and output a first current signal $I_1$ toward a second node $N_2$ in accordance with a first control signal $S_1$; a CG (common-gate) amplifier 120 configured to receive the first current signal $I_1$ and output a second voltage signal $V_2$ at a third node $N_3$ in accordance with a second control signal $S_2$; a first active inductor 160 configured to provide an inductive load at the third node $N_3$; a CS (common-source) CTLE (continuous-time linear equalizer) 130 configured to receive the second voltage signal $V_2$ and output a third voltage signal $V_3$ at a fourth node $N_4$ in accordance with a third control signal $S_3$; a second active inductor 170 configured to provide an inductive load at the fourth node $N_4$; and a decision circuit 150 configured to receive the third voltage signal $V_3$ and output a first decision $D_1$ in accordance with a clock signal CLK.

By way of example but not limitation, receiver 100 is a receiver of a 25 Giga-bits per second serial link (which is said to be a high-speed serial link), wherein a unit interval is equal to 1/25 GHz, i.e. 40 ps.

Receiver 100 is embodied in a differential signaling scheme, wherein a voltage signal comprises two voltages denoted with suffixes "+" and "−," respectively, attached in subscript, and a value of said voltage signal is defined by a difference between said two voltages. For instance, $V_1$ ($V_2$, $V_3$) comprises $V_{1+}$($V_{2+}$, $V_{3+}$) and $V_{1-}$($V_{2-}$, $V_{3-}$), and a value of $V_1$ ($V_2$, $V_3$) is defined as $V_{1+}$−$V_{1-}$($V_{2+}$−$V_{2-}$, $V_{3+}$−$V_{3-}$). Likewise, a current signal comprises two currents denoted with suffixes "+" and "−," respectively, attached in subscript, and a value of said current signal is defined by a difference between said two currents. For instance, $I_1$ comprises $I_{1+}$ and $I_{1-}$, and a value of $I_1$ is defined as $I_{1+}$−$I_{1-}$. In addition, a node in FIG. 1 represents two nodes denoted with suffixes "+" and "−" attached in subscript pertaining to the two voltages or currents of a signal associated with that node. For instance: $N_1$ ($N_2$, $N_3$, $N_4$) comprises $N_{1+}$($N_{2+}$, $N_{3+}$, $N_{4+}$) and $N_{1-}$($N_{2-}$, $N_{3-}$, $N_{4-}$); "receiving $V_1$ from node $N_1$" means "receiving $V_{1+}$ and $V_{1-}$ from nodes $N_{1+}$ and $N_{1-}$, respectively"; and "outputting $V_2$ at node $N_3$" means "outputting $V_{2+}$ and $V_{2-}$ at nodes $N_{3+}$ and $N_{3-}$, respectively." These conventions are used throughout this disclosure.

Figure 1B:
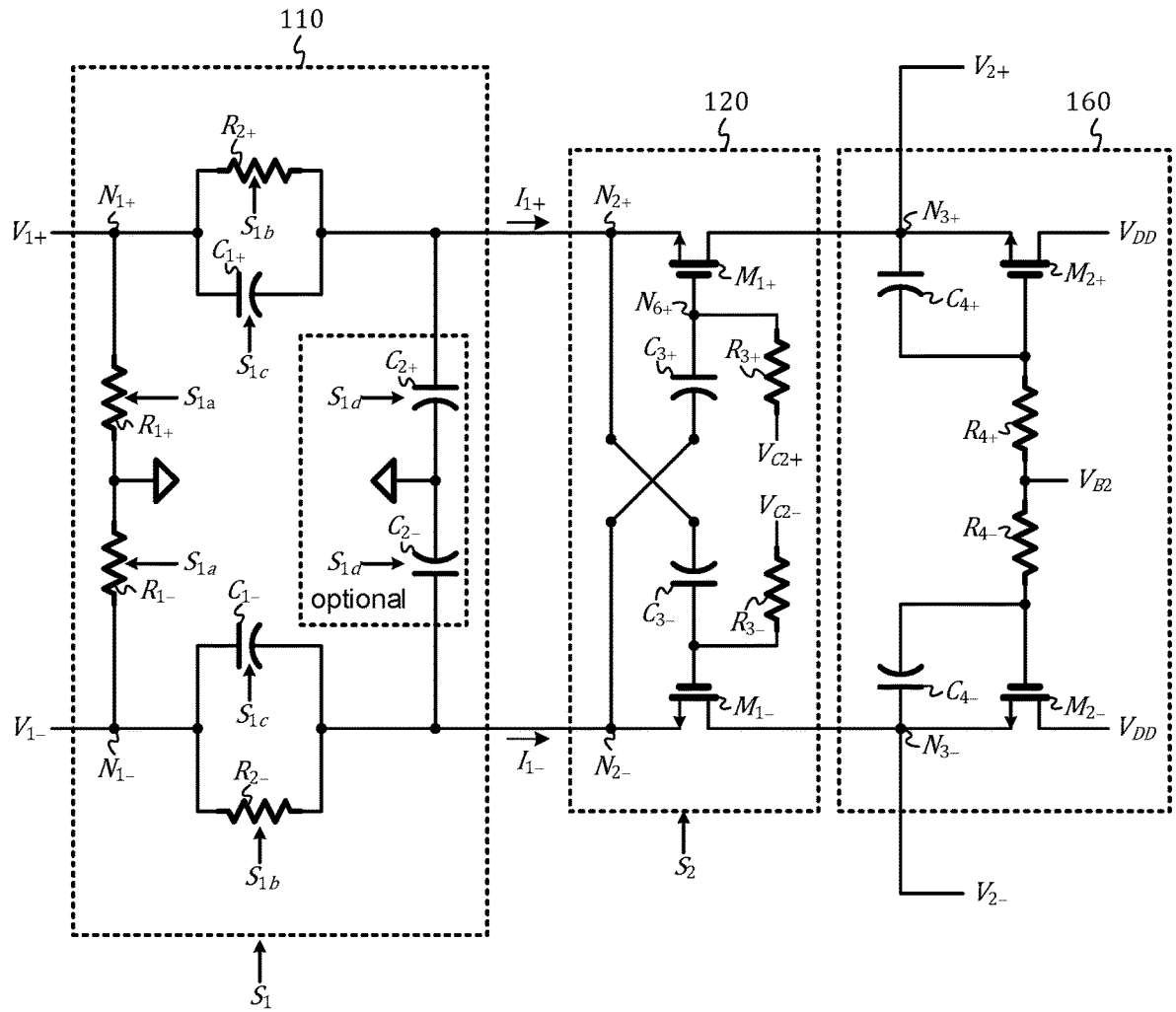
FIG. 1B shows a schematic diagram of an exemplary embodiment of the passive CTLE, the CG amplifier, and the first active inductor of the receiver of FIG. 1A.

A schematic diagram of an exemplary embodiment of passive CTLE 110, CG amplifier 120, and the first active inductor 160 are shown in FIG. 1B and explained as follows.

Passive CTLE 110 receives voltages $V_{1+}$ and $V_{1-}$ from nodes $N_{1+}$ and $N_{1-}$ and outputs currents $I_{1+}$ and $I_{1-}$ toward nodes $N_{2+}$ and $N_{2-}$, respectively and comprises: a pair of shunt resistors $R_{1+}$ and $R_{1-}$ controlled by $S_{1a}$ and configured to shunt nodes $N_{1+}$ and $N_{1-}$, respectively, to ground; a pair of tunable series resistors $R_{2+}$ and $R_{2-}$ controlled by $S_{1b}$ and configured to provide a serial connection between nodes $N_{1+}$ and $N_{2+}$ and a serial connection between nodes $N_{1-}$ and $N_{2-}$, respectively; and a pair of tunable series capacitors $C_{1+}$ and $C_{1-}$ controlled by $S_{1c}$ and configured to provide a serial connection between nodes $N_{1+}$ and $N_{2+}$ and a serial connection between nodes $N_{1-}$ and $N_{2-}$, respectively, wherein $S_{1a}$, $S_{1b}$, and $S_{1c}$ are three control signals that collectively embody the first control signal $S_1$. In FIG. 1B, due to using differential signaling, circuit elements are configured in pairs and every circuit element with suffix "+" has an identical counterpart with suffix "−" attached in subscript. For instance, $R_{1-}$ is a counterpart of $R_{1+}$, while and $R_{1+}$ and $R_{1-}$ are identical.

In an embodiment, an input resistance of CG amplifier 120 as presented across nodes $N_2$+ and $N_2$− is substantially smaller than a serial resistance of passive CTLE 110 (i.e. substantially smaller than a resistance of $R_{2+}$ and $R_{2-}$). As a result, an input resistance $R_{in}$ of passive CTLE 110 as observed across nodes $N_{1+}$ and $N_{1-}$ can be approximated by the following equation:

$$R_{in} \approx (R_{1+} + R_{1-}) \| (R_{2+} + R_{2-}) \quad (1)$$

Here, "||" denotes a value resulting from a parallel connection. A first function of passive CTLE 110 is impedance matching, which is fulfilled by adjusting $R_{1+}$ and $R_{2+}$ (and thus $R_{1-}$ and $R_{2-}$) so that $R_{in}$ is equal to a target value. A second function of passive CTLE 110 is equalization, which is fulfilled by providing a frequency dependent transfer characteristic from $V_1$ to $I_1$ where $V_1 \equiv V_{1+} - V_{1-}$ and $I_1 \equiv I_{1+} - I_{1-}$. In a low-frequency extreme, $C_{1+}$ and $C_{1-}$ are negligible and $I_1/V_1$ is approximately $1/(R_{2+}+R_{2-})$. In a high frequency extreme, $R_{2+}$ and $R_{2-}$ are negligible and $I_1/V_1$ is approximately $s(C_{1+}+C_{1-})$, wherein "s" is a complex variable of Laplace transform that is associated with a frequency of interest. As such, a response at a low frequency can be adjusted to a target value by tuning $R_{2+}$ and $R_{2-}$, while a response at a high frequency can be adjusted to a target value by tuning $C_{1+}$ and $C_{1-}$. However, when adjusting $R_{2+}$ and $R_{2-}$, $R_{1+}$ and $R_{1-}$ also need to be adjusted according to equation (1) to maintain the same $R_{in}$. By way of example but not limitation, in an embodiment: $R_{1+}$ and $R_{1-}$ are 60 Ohm, $R_{2+}$ and $R_{2-}$ are 300 Ohm, and $C_{1+}$ and $C_{1-}$ are 300 fF; this way, the input resistance $R_{in}$ is approximately 100 Ohm, which is a typical target value of impedance matching.

In an optional embodiment, passive CTLE 110 further includes a pair of tunable shunt capacitors $C_{2+}$ and $C_{2-}$ controlled by $S_{1d}$ and configured to shunt nodes $N_{2+}$ and $N_{2-}$, respectively, to ground, where $S_{1d}$ is an additional part of the first control signal $S_1$. This optional embodiment allows another degree of freedom in adjusting a response at a high frequency.

In another optional embodiment, not shown in FIG. 1B, passive CTLE 110 further includes a tunable resistor placed across nodes $N_{2+}$ and $N_{2-}$ and controlled by yet another additional part of the first control signal $S_1$. This allows another degree of freedom in adjusting a response at a low frequency.

CG amplifier 120 comprises a pair of NMOS (n-channel metal oxide semiconductor) transistors $M_{1+}$ and $M_{1-}$ configured to receive $I_{1+}$ and $I_{1-}$ via nodes $N_{2+}$ and $N_{2-}$ and output voltages $V_{2+}$ and $V_{2-}$ at nodes $N_{3+}$ and $N_{3-}$, respectively; a pair of AC (alternate current) coupling capacitors $C_{3+}$ and $C_{3-}$ configured to cross couple NMOS transistors $M_{1+}$ and $M_{1-}$, and a pair of DC (direct current) coupling resistors $R_{3+}$ and $R_{3-}$ configured to couple bias voltages $V_{C2+}$ and $V_{C2-}$ to NMOS transistors $M_{1+}$ and $M_{1-}$, respectively. Here, $V_{C2+}$ and $V_{C2-}$ collectively embody the second control signal $S_2$. Detailed descriptions regarding connection such as "the source, the gate, and the drain of NMOS transistor $M_{1+}$ connect to nodes $N_{2+}$, $N_{6+}$, and $N_{3+}$, respectively," are omitted since they are obvious to those of ordinary skill in the art. As far as circuit topology is concerned, CG amplifier 120 is readily known in the prior art and thus not explained in detail here. However, a distinct feature of this embodiment is: bias voltages $V_{C2+}$ and $V_{C2-}$ are adjusted to compensate a DC offset of receiver 100. For instance, if $V_3$ has a positive DC offset, i.e. $V_3>0$, in the absence of input signal (i.e. $V_1=0$), $V_{C2+}$ will be adjusted to be higher than $V_{C2-}$ to compensate the positive DC offset. By way of example but not limitation, in an embodiment: AC coupling capacitors $C_{3+}$ and $C_{3-}$ are 50 fF; W/L (which stands for width/length) of NMOS transistors $M_{1+}$ and $M_{1-}$ are 4 µm/30 nm; $V_{C2+}$ is 600 mV; and $V_{C2-}$ is 595 mV; this example applies to a scenario where receiver 100 has a positive DC offset.

The first active inductor 160 comprises: a pair of NMOS transistors $M_{2+}$ and $M_{2-}$; a pair of AC coupling capacitors $C_{4+}$ and $C_{4-}$ configured to provide gate-to-source coupling for NMOS transistors $M_{2+}$ and $M_{2-}$, respectively; and a pair of DC coupling resistors $R_{4+}$ and $R_{4-}$ configured to couple a bias voltage $V_{B2}$ to NMOS transistors $M_{2+}$ and $M_{2-}$, respectively. As far as circuit topology and principle are concerned, the first active inductor 160 is readily known in the prior art and thus not explained in detail here. However, there are some distinct features of this embodiment: first, the bias voltage $V_{B2}$ is higher than the supply voltage ($V_{DD}$) to allow ample headroom for $V_{2+}$ and $V_{2-}$; second, AC coupling capacitors $C_{4+}$ and $C_{4-}$ provide an extrinsic gate-to-source capacitance substantially greater than an intrinsic gate-to-source capacitance of NMOS transistors $M_{2+}$ and $M_{2-}$ to effectively enhance an inductive impedance. There are numerous advantages in using the first active inductor 160 as a load to CG amplifier 120. First, NMOS transistors $M_{2+}$ and $M_{2-}$, once properly biased in a saturation region, can provide a good reverse isolation and thus help to effectively alleviate an impact of a noise at "$V_{DD}$"; second, as a transconductance of NMOS transistors $M_{1+}$ and $M_{1-}$ compresses in a large current scenario, a transconductance of NMOS transistors $M_{2+}$ and $M_{2-}$ also compresses and thus helps to maintain a good linearity for an overall gain (of CG amplifier 120), which is determined by a ratio between a transconductance of NMOS transistors $M_{1+}$ and $M_{1-}$ and a transconductance of NMOS transistors $M_{2+}$ and $M_{2-}$; third, the first active inductor 160 presents an inductive impedance that can compensate a parasitic capacitance at nodes $N_{3+}$ and $N_{3-}$, and thus effectively alleviating secondary dispersion caused by the parasitic capacitance. As mentioned earlier, the bias voltage $V_{B2}$ is higher than the supply voltage $V_{DD}$. In an embodiment, the bias voltage $V_{B2}$ is generated from a step-up DC/DC converter, which is a charge pump that can generate a DC voltage higher than its supply voltage. Step-up DC/DC converters are readily known in the prior art and thus not explained in detail here. By way of example but not limitation, in an embodiment: W/L of NMOS transistors $M_{2+}$ and $M_{2-}$ are 1 µm/30 nm; $C_{4+}$ and $C_{4-}$ are 25 fF; $R_{4+}$ and $R_{4-}$ are 5 KOhm; and $V_{B2}$ is 1.1V.

Figure 1C:
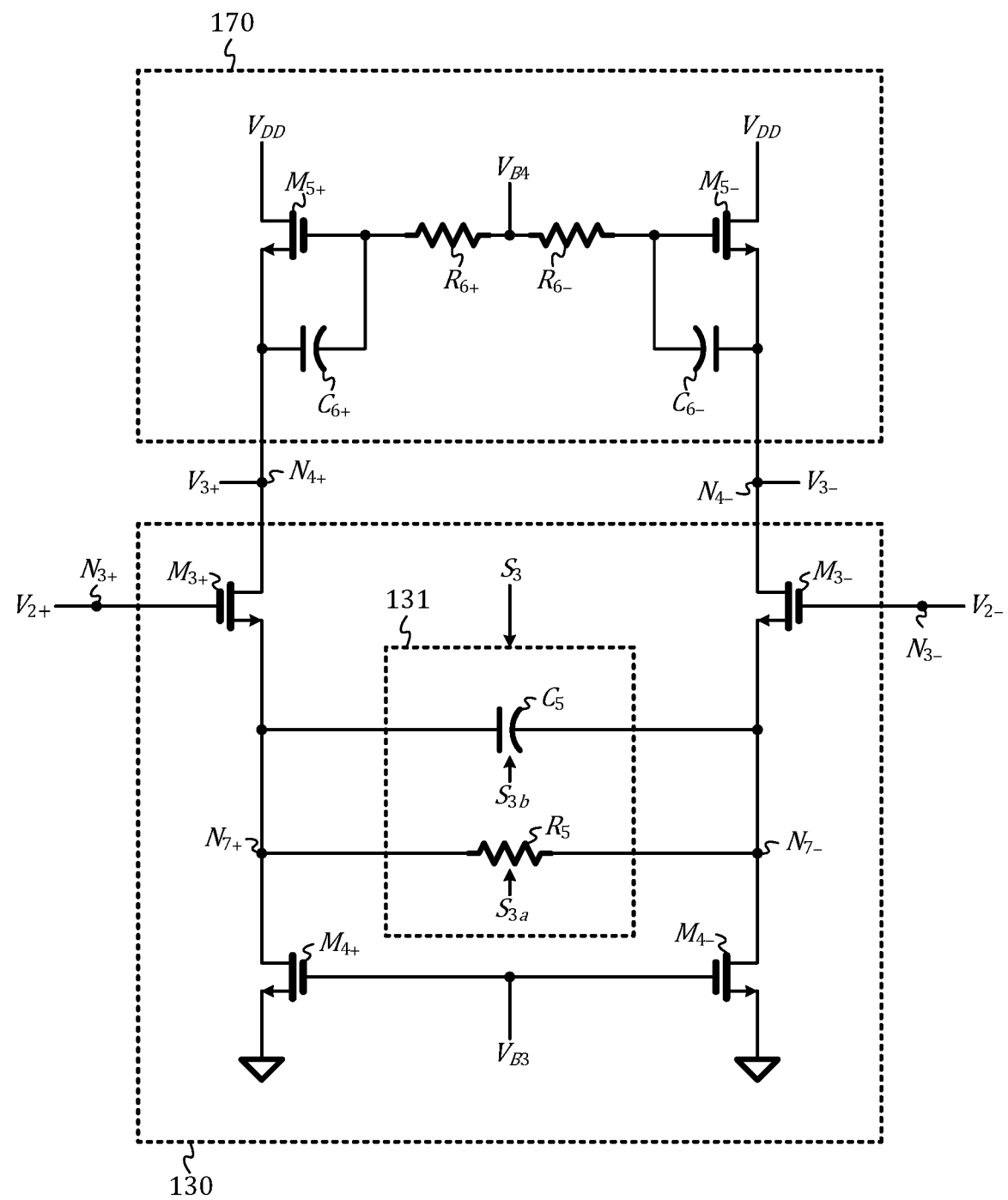
FIG. 1C shows a schematic diagram of an exemplary embodiment of the CS CTLE and the second active inductor of the receiver of FIG. 1A.

A schematic diagram of an exemplary embodiment of CS CTLE 130 and the second active inductor 170 is shown in FIG. 1C. CS CTLE 130 comprises: a pair of NMOS transistors $M_{3+}$ and $M_{3-}$ embodying a common-source amplifier configured to receive $V_{2+}$ and $V_{2-}$ from nodes $N_{3+}$ and $N_{3-}$ and output $V_{3+}$ and $V_{3-}$ at nodes $N_{4+}$ and $N_{4-}$ in accordance with a source degeneration condition across a pair of source nodes $N_{7+}$ and $N_{7-}$, respectively; a pair of NMOS transistors $M_{4+}$ and $M_{4-}$ embodying a current source configured to establish a biasing condition at source nodes $N_{7+}$ and $N_{7-}$, respectively; and a source degeneration network 131 configured to provide source degeneration across $N_{7+}$ and $N_{7-}$ in accordance with the third tuning signal $S_3$. Source degeneration network 131 comprises a tunable resistor $R_5$ controlled by $S_{3a}$ and a tunable capacitor $C_5$ controlled by $S_{3b}$, wherein $R_5$ and $C_5$ jointly determine the source degeneration condition across $N_{7+}$ and $N_{7-}$, and $S_{3a}$ and $S_{3b}$ are two control signals that collectively embody the third tuning signal $S_3$. An impedance $Z_{deg}$ of the source degeneration network 131 is determined according to the following equation:

$$Z_{deg} = \frac{R_5}{1+sR_5C_5} \qquad (2)$$

$Z_{deg}$ determines a gain of the common-source amplifier embodied by NMOS transistors $M_{3+}$ and $M_{3-}$: a larger value of $Z_{deg}$ leads to a greater source degeneration and consequently a lower gain. In a low-frequency extreme where $sR_5C_5$ is negligible, $Z_{deg}$ is maximal and approximately equal to $R_5$. In a high-frequency extreme where $|sR_5C_5|\gg 1$, $Z_{deg}$ is approximately equal to $1/sC$. Therefore, CS CTLE 130 can have a frequency dependent source degeneration and consequently a frequency dependent gain, and an equalization function is thus fulfilled. Adjusting $R_5$ can adjust a low-frequency gain of CS CTLE 130, while adjusting $C_5$ can adjust a transition frequency, above which CS CTLE 130 transitions into the high-frequency extreme. By way of example but not limitation, in an embodiment: W/L of NMOS transistors $M_{3+}$ and $M_{3-}$ are 4 µm/30 nm; W/L of NMOS transistors $M_{4+}$ and $M_{4-}$ are 12 µm/100 nm; $V_{B3}$ is 400 mV; $C_5$ is 250 fF; and $R_5$ is 500 Ohm.

The second active inductor 170 comprises a pair of NMOS transistors $M_{5+}$ and $M_{5-}$ configured to provide an inductive load at nodes $N_{4+}$ and $N_{4-}$, respectively, a pair of AC coupling capacitors $C_{6+}$ and $C_{6-}$ configured to provide gate-to-source coupling for NMOS transistors $M_{5+}$ and $M_{5-}$, respectively; and a pair of DC coupling resistors $R_{6+}$ and $R_{6-}$ configured to couple a bias voltage $V_{B4}$ to NMOS transistors $M_{5+}$ and $M_{5-}$, respectively. As in the case of the first active inductor 160, bias voltage $V_{B4}$ is higher than the supply voltage of $V_{DD}$ to allow an ample headroom for $V_{3+}$ and $V_{3-}$; NMOS transistors $M_{5+}$ and $M_{5-}$ provide reverse isolation and help alleviating an impact of a noise at $V_{DD}$; NMOS transistors $M_{5+}$ and $M_{5-}$ can compensate nonlinearity of NMOS transistors $M_{3+}$ and $M_{3-}$ and thus improve linearity of an overall gain; and the second active inductor 170 provides an inductive impedance to compensate a parasitic capacitance at nodes $N_{4+}$ and $N_{4-}$ and thus alleviate secondary dispersion. By way of example but not limitation, in an embodiment: W/L of NMOS transistors $M_{5+}$ and $M_{5-}$ are 1 µm/30 nm; $C_{6+}$ and $C_{6-}$ are 25 fF; $R_{6+}$ and $R_{6-}$ are 5 KOhm; and $V_{B4}$ is 1.1V.

In an embodiment, decision circuit 150 comprises a flip flop that samples $V_3$ and outputs the first decision $D_1$ in accordance with the clock signal CLK. Upon a trigger by an edge of CLK, decision circuit 150 samples $V_3$, detects its polarity, and updates a value of $D_1$ accordingly: $D_1$ is 1 if $V_3$ is positive, and 0 if $V_3$ is negative. Flip flops are well known in the prior art and thus not described in detail here. In an embodiment, a frequency of CLK is 25 GHz, and the update of the value of $D_1$ is triggered by a rising edge of CLK; this is said to be a "full-rate" embodiment. In another embodiment, a frequency of CLK is 12.5 GHz, and the update of the value of $D_1$ is triggered by both a rising edge and a falling edge of CLK; this is said to be a "half-rate" embodiment. Note that a double-edge triggered flip flop (i.e. triggered by both a rising edge and a falling edge) can be embodied by two single-edge triggered flip flops. In an optional embodiment, the flip flop includes a pre-amplifier, which is used to amplify $V_3$ before detection. In an optional embodiment, the pre-amplifier is a common-source amplifier with a source degeneration network, just like CS CTLE 130 of FIG. 1C; this allows the pre-amplifier to have an equation function.

Figure 2A:
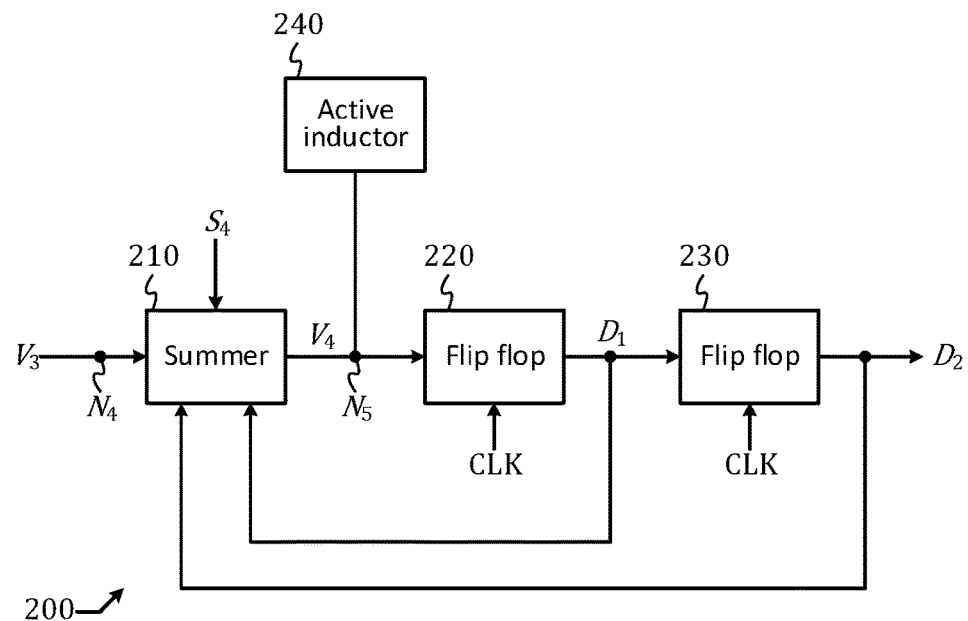
FIG. 2A shows a functional block diagram of a decision feedback equalizer.

In an alternative embodiment, decision circuit 150 is embodied by a decision feedback equalizer, as exemplified by a decision feedback equalizer 200, a functional block diagram of which is shown in FIG. 2A. Decision feedback equalizer 200 comprises: a summer 210 configured to receive the third voltage signal $V_3$ (from node $N_4$), the first decision $D_1$, and a second decision $D_2$, and output a fourth voltage signal $V_4$ at a fifth node $N_5$ in accordance with a fourth control signal $S_4$; a third active inductor 240 configured to provide an inductive load at the fifth node $N_5$; a first flip flop 220 configured to receive the fourth voltage signal $V_4$ and output the first decision $D_1$ in accordance with the clock signal CLK; and a second flip flop 230 configured to receive the first decision $D_1$ and output a second decision $D_2$ in accordance with the clock signal CLK.

Figure 2B:
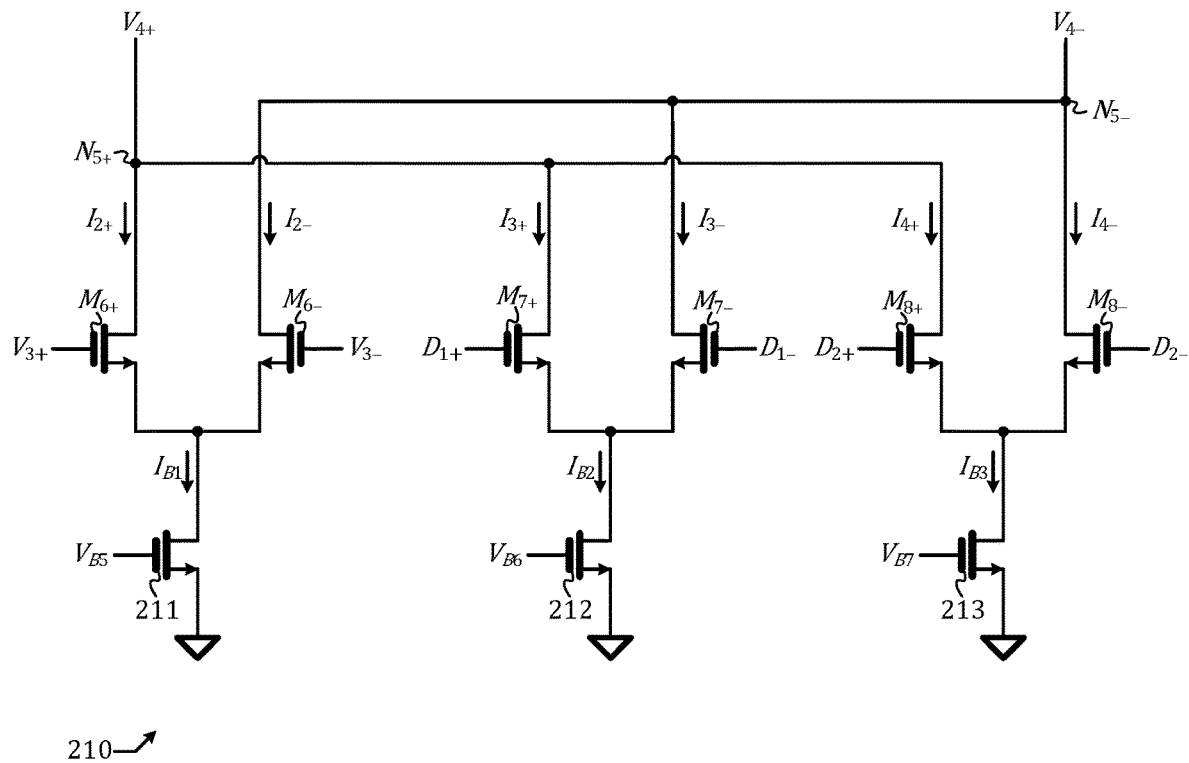
FIG. 2B shows a schematic diagram of an exemplary embodiment of the summer of the decision feedback equalizer of FIG. 2A.

A schematic diagram of an exemplary embodiment of summer 210 is shown in FIG. 2B. Summer 210 comprises: a first NMOS transistor 211 configured to output a first bias current $I_{B1}$ in accordance with a first bias voltage $V_{B5}$; a second NMOS transistor 212 configured to output a second bias current $I_{B2}$ in accordance with a second bias voltage $V_{B6}$; a third NMOS transistor 213 configured to output a third bias current $I_{B3}$ in accordance with a third bias voltage $V_{B7}$; a first differential pair of NMOS transistors $M_{6+}$ and $M_{6-}$ configured to receive $V_{3+}$ and $V_{3-}$ and output currents $I_{2+}$ and $I_{2-}$ to nodes $N_{5+}$ and $N_{5-}$, respectively, in accordance with the first bias current $I_{B1}$; a second differential pair of NMOS transistors $M_{7+}$ and $M_{7-}$ configured to receive $D_{1+}$ and $D_{1-}$ and output currents $I_{3+}$ and $I_{3-}$ to nodes $N_{5+}$ and $N_{5-}$, respectively, in accordance with the second bias current $I_{B2}$; and a third differential pair of NMOS transistors $M_{8+}$ and $M_{8-}$ configured to receive $D_{2+}$ and $D_{2-}$ and output currents $I_{4+}$ and $I_{4-}$ to nodes $N_{5+}$ and $N_{5-}$, respectively, in accordance with the third bias current $I_{B3}$. Here, $D_{1+}$ and $D_{1-}$ are a differential voltage embodiment of $D_1$: $D_{1+}$ is 0.9V and $D_{1-}$ is 0V if $D_1$ is 1; $D_{1+}$ is 0V and $D_{1-}$ is 0.9V if $D_1$ is 0. Likewise, $D_{2+}$ and $D_{2-}$ are a differential voltage embodiment of $D_2$: $D_{2+}$ is 0.9V and $D_{2-}$ is 0V if $D_2$ is 1; $D_{2+}$ is 0V and $D_{2-}$ is 0.9V if $D_2$ is 0. The three bias voltages $V_{B5}$, $V_{B6}$, and $V_{B7}$ collectively embody the fourth control signal $S_4$. Currents $I_{2+}$, $I_{3+}$, and $I_{4+}$ are summed at node $N_{5+}$, while currents $I_{2-}$, $I_{3-}$, and $I_{4-}$ are summed at node $N_{5-}$. With the third active inductor 230 providing an inductive load at nodes $N_{5+}$ and $N_{5-}$, voltages $V_{4+}$ and $V_{4-}$ are established. By way of example but not limitation, in an embodiment: W/L of NMOS transistors $M_{6+}$ and $M_{6-}$ are 4 µm/30 nm; W/L of NMOS transistors $M_{7+}$ and $M_{7-}$ are 1 µm/30 nm; W/L of NMOS transistors $M_{8+}$ and $M_{8-}$ are 1 µm/30 nm; W/L of NMOS transistor 211 is 24 µm/100 nm; W/L of NMOS transistor 212 is 6 µm/100 nm; W/L of NMOS transistor 213 is 6 µm/100 nm; $V_{B5}$ is 450 mV; $V_{B6}$ is 450 mV; and $V_{B7}$ is 450 mV.

A general principle of a decision feedback equalizer is readily known in the prior art and not explained in detail here. For instance, by adjusting $S_4$ (i.e. $V_{B5}$, $V_{B6}$, and $V_{B7}$ in summer 210), we can adjust an amount of equalization. In decision feedback equalizer 200, however, there is a distinct feature that is absent in a conventional decision feedback equalizer: the third active inductor 240 is used to provide an inductive load to summer 210. The third active inductor 240 is of the same circuit topology as the first active inductor 160 and the second active inductor 170, and likewise can fulfill three functions: alleviating an impact of noise of the supply voltage; improving overall linearity; and alleviating secondary dispersion. These three functions are absent in a conventional decision equalizer. By way of example but not limitation, in an embodiment, the third active inductor 240 is identical to the second active inductor 170.

Note that decision feedback equalizer 200 implements a two-tap decision feedback, which is merely an example but not limitation. Also, decision feedback equalizer 200 uses a "full-rate" architecture, which is also merely an example but not limitation. Persons skilled in the art will understand how to implement a single-tap or a multi-tap decision feedback equalizer based on a "full-rate," a "half-rate," or even a "quad-rate" embodiment.

In an optional embodiment, the summer 210 further includes a pre-amplifier (not shown in FIG. 2B) that is placed preceding the first differential pair of NMOS transistors $M_{6+}$ and $M_{6-}$, so that $V_3$ is amplified first by the pre-amplifier and then received by the first differential pair of NMOS transistors $M_{6+}$ and $M_{6-}$. In an optional embodiment, the pre-amplifier is a common-source amplifier with a source degeneration network, just like CS CTLE 130 of FIG. 1C; this allows the pre-amplifier to have an equation function.

Tunable capacitors (such as capacitors $C_{1+}$, $C_{1-}$, $C_{2+}$, and $C_{2-}$ in FIG. 1B) and tunable resistors (such as resistors $R_{1+}$, $R_{1-}$, $R_{2+}$, and $R_{2-}$ in FIG. 1B) are readily known in the prior art and can be implemented in various ways. For instance, a tunable capacitor can be implemented using a switch-capacitor array comprising a parallel connection of a plurality of switch-capacitor units, wherein each switch-capacitor unit comprises a serial connection of a capacitor and a switch controlled by a respective bit of the controls signal of the tunable capacitor. Likewise, a tunable resistor can be implemented using a switch-resistor array comprising a parallel connection of a plurality of switch-resistor units, wherein each switch-resistor unit comprises a serial connection of a resistor and a switch controlled by a respective bit of the control signal of the tunable resistor.

Figure 3:
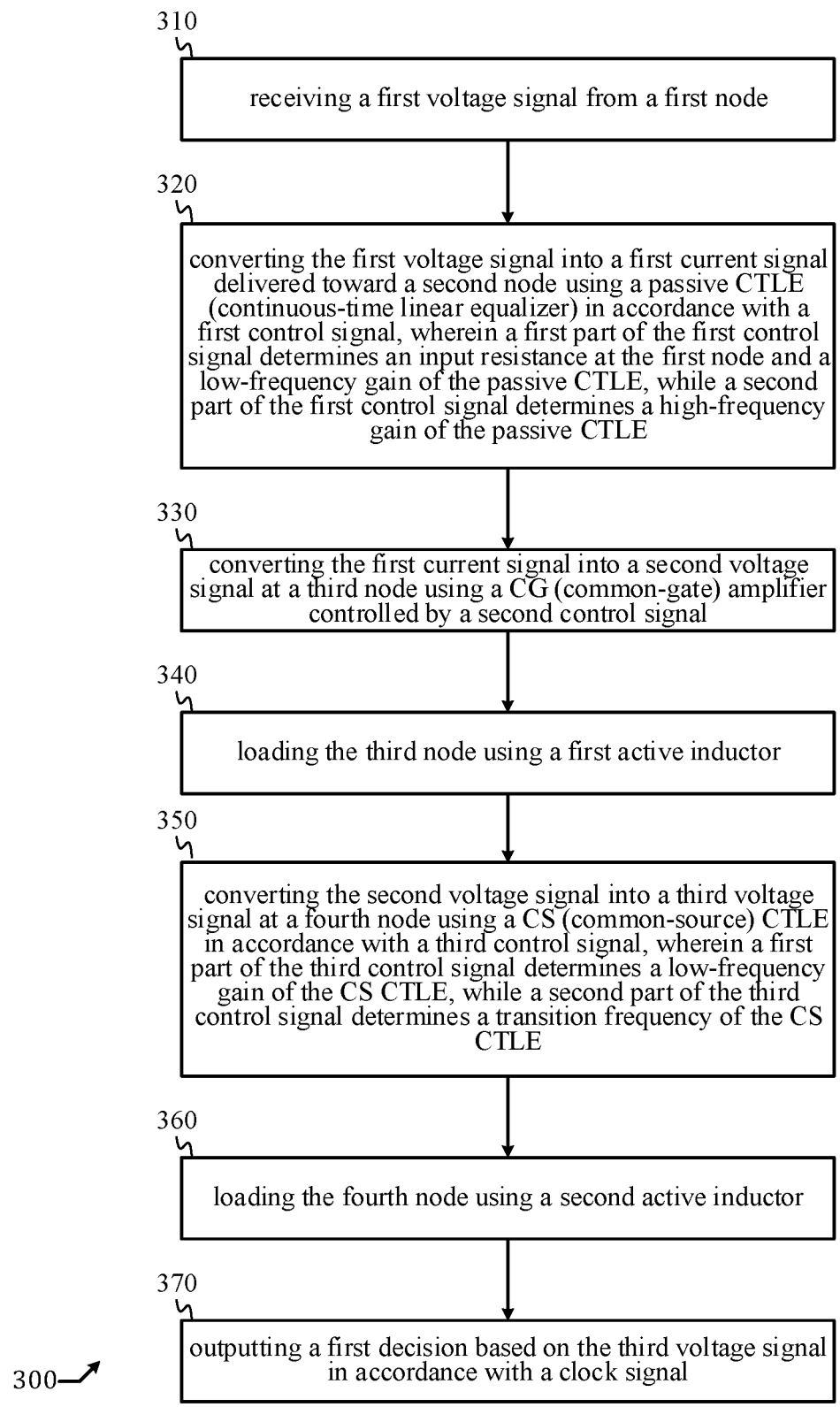
FIG. 3 shows a flow diagram of a method in accordance with an embodiment of the present disclosure.

As depicted in a flow diagram shown in FIG. 3, in an embodiment, a method comprises the following steps: (step 310) receiving a first voltage signal from a first node; (step 320) converting the first voltage signal into a first current signal delivered toward a second node using a passive CTLE (continuous-time linear equalizer) in accordance with a first control signal, wherein a first part of the first control signal determines an input resistance at the first node and a low-frequency gain of the passive CTLE, while a second part of the first control signal determines a high-frequency gain of the passive CTLE; (step 330) converting the first current signal into a second voltage signal at a third node using a CG (common-gate) amplifier controlled by a second control signal; (step 340) loading the third node using a first active inductor; (step 350) converting the second voltage signal into a third voltage signal at a fourth node using a CS (common-source) CTLE in accordance with a third control signal, wherein a first part of the third control signal determines a low-frequency gain of the CS CTLE, while a second part of the third control signal determines a transition frequency of the CS CTLE; (step 360) loading the fourth node using a second active inductor; and (step 370) outputting a first decision based on the third voltage signal in accordance with a clock signal.

Although NMOS transistors are used in examples and explicitly stated in the appended claims, one can choose to use PMOS (p-channel metal oxide semiconductor) transistors instead. A circuit of NMOS transistors is functionally equivalent to a circuit of PMOS transistors by replacing every NMOS transistor with a PMOS transistor and swapping the power supply node with the ground node. Therefore, will be understood that, replacing NMOS transistors with PMOS transistors still falls within the scope and spirit of the embodiments described herein.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:
1. A receiver comprising:
   a passive CTLE (continuous-time linear equalizer) configured to receive a first voltage signal from a first node and output a first current signal to a second node in accordance with a first control signal;
   a CG (common-gate) amplifier configured to receive the first current signal and output a second voltage signal at a third node in accordance with a second control signal;
   a first active inductor configured to provide an inductive load at the third node;
   a CS (common-source) CTLE configured to receive the second voltage signal and output a third voltage signal at a fourth node in accordance with a third control signal;
   a second active inductor configured to provide an inductive load at the fourth node; and
   a decision circuit configured to receive the third voltage signal and output a first decision in accordance with a clock signal, wherein: a first part of the first control signal determines an input resistance at the first node and a low-frequency gain of the passive CTLE, a second part of the first control signal determines a high-frequency gain of the passive CTLE, a first part of the third control signal determines a low-frequency gain of the CS CTLE, and a second part of the third control signal determines a transition frequency of the CS CTLE.

2. The receiver of claim 1, wherein the passive CTLE comprise: a shunt resistor configured to shunt the first node to ground, and a series resistor configured to provide a serial connection between the first node and the second node, wherein the shunt resistor and the series resistor are controlled by the first part of the first control signal.

3. The receiver of claim 2, wherein the passive CTLE further comprises: a series capacitor configured to provide a further serial connection between the first node and the second node, wherein the series capacitor is controlled by the second part of the first control signal.

4. The receiver of claim 1, wherein the CG amplifier comprises a pair of NMOS (n-channel metal oxide semiconductor) transistors configured to receive the first current signal and output the second voltage signal at the third node, a pair of AC (alternate current) coupling capacitors configured to cross couple said pair of NMOS transistors, and a pair of DC (direct current) coupling resistors configured to provide a pair of bias voltages to said pair of NMOS transistors, wherein said pair of bias voltages collectively embody the second control signal.

5. The receiver of claim 4, wherein said pair of bias voltages are adjusted to compensate a DC offset of the receiver.

6. The receiver of claim 1, wherein the first active inductor comprises: a pair of NMOS (n-channel metal oxide semiconductor) transistors configured to provide a load at the third node, a pair of AC (alternate current) coupling capacitors configured to enhance a gate-to-source capacitance of said pair of NMOS transistors, and a pair of DC (direct current) coupling resistors configured to couple a bias voltage to said pair of NMOS transistors.

7. The receiver of claim 6, wherein said bias voltage is higher than a supply voltage of said pair of NMOS transistors.

8. The receiver of claim 1, wherein the CS CTLE comprises: a first pair of NMOS (n-channel metal oxide semiconductor) transistors embodying a common-source amplifier and configured to receive the second voltage signal and output the third voltage signal at the fourth node in accordance with a source degeneration condition across a pair of source nodes; a source degeneration network placed across said pair of source nodes; and a second pair of NMOS transistors embodying a current source and configured to establish a bias condition at said pair of source nodes.

9. The receiver of claim 8, wherein the source degeneration network comprises a parallel connection of a resistor and a capacitor, wherein the resistor is controlled by the first part of the third control signal, while the capacitor is controlled by the second part of the third control signal.

10. The receiver of claim 1, wherein the second active inductor comprises: a pair of NMOS (n-channel metal oxide semiconductor) transistors configured to provide a load at the fourth node, a pair of AC (alternate current) coupling capacitors configured to enhance a gate-to-source capacitance of said pair of NMOS transistors, and a pair of DC (direct current) coupling resistors configured to couple a bias voltage to said pair of NMOS transistors.

11. The receiver of claim 10, wherein said bias voltage is higher than a supply voltage of said pair of NMOS transistors.

12. The receiver of claim 1, wherein the decision circuit comprises a flip flop configured to sample the third voltage signal upon an edge of the clock signal and output the first decision in accordance with a polarity of the third voltage signal.

13. The receiver of claim 1, wherein the decision circuit comprises a decision feedback equalizer, wherein the decision feedback equalizer comprises: a summer configured to receive the third voltage signal and the first decision and output a fourth voltage signal at a fifth node in accordance with a fourth control signal, a third active inductor configured to provide an inductive load at the fifth node, and a first flip flop configured to receive the fourth voltage signal and output the first decision in accordance with an edge of the clock signal.

14. The receiver of claim 13, wherein the third active inductor comprises a pair of NMOS (n-channel metal oxide semiconductor) transistors configured to provide a load at the fifth node, a pair of AC (alternate current) coupling capacitors configured to enhance a gate-to-source capacitance of said pair of NMOS transistors, and a pair of DC (direct current) coupling resistors configured to couple a bias voltage to said pair of NMOS transistors.

15. The receiver of claim 14, wherein said bias voltage is higher than a supply voltage of said pair of NMOS transistors.

16. The receiver of claim 13, wherein the summer comprises: a first NMOS (n-channel metal oxide semiconductor) transistor configured to output a first bias current in accordance with a first part of the fourth control signal, a second NMOS transistor configured to output a second bias current in accordance with a second part of the fourth control signal, a first differential pair of NMOS transistors configured to receive the third voltage signal and output a second current signal to the fifth node in accordance with the first bias current, and a second differential pair of NMOS transistors configured to receive the first decision and output a third current signal to the fifth node in accordance with the second bias current.

17. The receiver of claim 16, wherein the decision feedback equalizer further comprises a second flip flop configured to receive the first decision and output a second decision in accordance with an edge of the clock signal.

18. The receiver of claim 17, wherein the summer further comprises a third NMOS transistor configured to output a third bias current in accordance with a third part of the fourth control signal, and a third differential pair of NMOS transistors configured to receive the second decision and output a fourth current signal to the fifth node in accordance with the third bias current.

19. The receiver of claim 13, wherein the fourth control signal determines an amount of equalization of the decision feedback equalizer.

20. A method comprising:
receiving a first voltage signal from a first node;
converting the first voltage signal into a first current signal delivered toward a second node using a passive CTLE (continuous-time linear equalizer) in accordance with a first control signal, wherein a first part of the first control signal determines an input resistance at the first node and a low-frequency gain of the passive CTLE, while a second part of the first control signal determines a high-frequency gain of the passive CTLE;
converting the first current signal into a second voltage signal at a third node using a CG (common-gate) amplifier controlled by a second control signal;
loading the third node using a first active inductor;
converting the second voltage signal into a third voltage signal at a fourth node using a CS (common-source) CTLE in accordance with a third control signal, wherein a first part of the third control signal determines a low-frequency gain of the CS CTLE, while a second part of the third control signal determines a transition frequency of the CS CTLE;
loading the fourth node using a second active inductor; and
outputting a first decision based on the third voltage signal in accordance with a clock signal using a decision circuit.

* * * * *